United States Patent
Yang et al.

(10) Patent No.: US 11,545,622 B2
(45) Date of Patent: Jan. 3, 2023

(54) CMP STOP LAYER AND SACRIFICE LAYER FOR HIGH YIELD SMALL SIZE MRAM DEVICES

(71) Applicant: Taiwan Semiconductor Manufacturing Company, Ltd., Hsin-Chu (TW)

(72) Inventors: Yi Yang, Fremont, CA (US); Zhongjian Teng, Santa Clara, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 255 days.

(21) Appl. No.: 16/927,861

(22) Filed: Jul. 13, 2020

(65) Prior Publication Data

US 2020/0343444 A1    Oct. 29, 2020

Related U.S. Application Data

(63) Continuation of application No. 15/891,767, filed on Feb. 8, 2018, now Pat. No. 10,714,679.

(51) Int. Cl.
*H01L 43/12*    (2006.01)
*H01L 27/22*    (2006.01)
*C09G 1/02*    (2006.01)
*H01L 43/08*    (2006.01)
*H01L 43/02*    (2006.01)
*G11C 11/16*    (2006.01)
*H01L 29/82*    (2006.01)

(52) U.S. Cl.
CPC .......... *H01L 43/12* (2013.01); *C09G 1/02* (2013.01); *G11C 11/161* (2013.01); *H01L 27/222* (2013.01); *H01L 29/82* (2013.01); *H01L 43/02* (2013.01); *H01L 43/08* (2013.01)

(58) Field of Classification Search
CPC ......... H01L 43/12; H01L 43/02; H01L 43/08; H01L 29/82; H01L 27/222; C09G 1/02; G11C 11/161
See application file for complete search history.

(56) References Cited

U.S. PATENT DOCUMENTS

| | | |
|---|---|---|
| 8,975,088 B2 | 3/2015 | Satoh et al. |
| 9,070,869 B2 | 6/2015 | Jung et al. |
| 9,397,139 B1 | 7/2016 | Tan et al. |
| 9,780,301 B1 | 10/2017 | Chuang et al. |
| 2006/0054947 A1 | 3/2006 | Yoshiaki |

(Continued)

OTHER PUBLICATIONS

EPO Search Report, Application No. 19156079.6, dated Jun. 27, 2019, 8 pages.

*Primary Examiner* — Nilufa Rahim
(74) *Attorney, Agent, or Firm* — Haynes and Boone, LLP

(57) ABSTRACT

An array, such as an MRAM (Magnetic Random Access Memory) array formed of a multiplicity of layered thin film devices, such as MTJ (Magnetic Tunnel Junction) devices, can be simultaneously formed in a multiplicity of horizontal widths in the 60 nm range while all having top electrodes with substantially equal thicknesses and coplanar upper surfaces. This allows such a multiplicity of devices to be electrically connected by a common conductor without the possibility of electrical opens and with a resulting high yield.

20 Claims, 3 Drawing Sheets

(56) References Cited

U.S. PATENT DOCUMENTS

| | | |
|---|---|---|
| 2010/0193891 A1 | 8/2010 | Wang et al. |
| 2015/0091109 A1 | 4/2015 | Allinger |
| 2016/0181512 A1 | 6/2016 | Ahn |
| 2016/0351799 A1* | 12/2016 | Xue ........................ H01L 43/12 |
| 2017/0047510 A1 | 2/2017 | Chen |
| 2017/0053965 A1 | 3/2017 | Baek |
| 2017/0117323 A1* | 4/2017 | Braganca ................ H01L 43/02 |
| 2017/0243919 A1 | 8/2017 | Seong et al. |
| 2018/0205002 A1 | 7/2018 | Bak |
| 2018/0261649 A1 | 9/2018 | Annunziata |
| 2019/0245141 A1 | 8/2019 | Yang et al. |

* cited by examiner

| Slurry | pH value | Main Particle | Polish Rate For Encap (SiN) (A/min) | Polish Rate For CMP Sacrifice Layer (TiN) (A/min) | Polish Rate For CMP Stop Layer (TiN) (A/min) |
|---|---|---|---|---|---|
| Slurry1 | 5.0-6.0 | Zirconium Oxide | 550 | 50 | N/A |
| Slurry2 | 3.0-5.0 | Aluminum Oxide | N/A | 700 | 5 |

FIG. 2

CMP STOP LAYER AND SACRIFICE LAYER FOR HIGH YIELD SMALL SIZE MRAM DEVICES

This application is a divisional application of U.S. patent application Ser. No. 15/891,767, filed Feb. 8, 2018, the disclosure of which is herein incorporated by reference in its entirety.

BACKGROUND

1. Technical Field

This disclosure relates generally to the fabrication of magnetoresistive random access memory (MRAM) devices, specifically to methods of depositing and patterning multi-layered MTJ cells.

2. Description of the Related Art

Fabrication of magnetoresistive random-access memory (MRAM) devices normally involves a sequence of processing steps during which many layers of metals and dielectrics are deposited to form a stack and then the stack is patterned to form an array of separated magnetoresistive devices, such as MTJ (magnetic tunneling junctions) as well as top and bottom electrodes for making electrical connections to the devices. To define those magnetic tunnel junction (MTJ) cells in each MRAM device and make them non-interacting with each other (until such interconnections may be desired), precise patterning steps including photolithography and plasma etch such as reactive ion etching (RIE), ion beam etching (IBE) or their combination are usually involved. During photolithography, patterns are transferred from a photomask to a light-sensitive photoresist, then subsequently transferred to define arrays of MTJ devices by plasma etches, forming separate and non-interacting MTJ devices. After plasma etching, smaller size devices in the patterned array usually have less top electrode left because the photoresist covering them is consumed more quickly during this etching process. As a result of the disparity in electrode thicknesses which creates a non-planar top surface, it is challenging for the final top metal contact to connect them, resulting in open devices (devices where poor contacts are made). New approaches are needed if one wants to achieve high yield on small sizes (e.g. sub 60 nm) of MTJ devices. It must be noted that several prior art patents disclose approaches to address some of the difficulties alluded to above. For example, U.S. Pat. No. 9,070,869 (Jung et al) discloses a variety of layer constructions and U.S. Pat. No. 8,975,088 (Satoh et al) teaches several different masking layers. However, neither of these prior arts teach the methods to be disclosed herein nor do they demonstrate the results that are obtained by application of those methods.

SUMMARY

An object of the present disclosure is to provide a method of improving the yield of arrays of small-sized layered MTJ devices and of a multiplicity of such devices of various dimensions, by adding additional layers between the hard mask used for patterning such MTJ devices and the electrode that is the top layer of the MTJ stack to be patterned.

A further object of the present disclosure is to provide such a yield improvement that can be attributed to eliminating electrical opens associated with damage to the very small top electrodes.

A still further object of the present disclosure is to provide the above stated benefits to a multiplicity of MTJ devices of various sizes adjacently disposed and being simultaneously processed on a common substrate.

In typical prior art processes, patterns are transferred from photoresist to a dielectric hard mask, then to a top electrode, and then to the MTJ stack beneath the top electrode. After the etch process to complete the pattern transfer, the remaining portion of the top electrode on the smaller portions of the pattern is found to be reduced in size when the pattern feature sizes are 60 nm and below, resulting in an electric open (a failure in electrical conductivity) and great yield loss.

To eliminate these difficulties, the presently disclosed method inserts a CMP (chemical mechanical polishing) stop layer and a sacrifice layer between the photoresist hard mask pattern and the electrode. After plasma etch, any photoresist consumption difference would only result in different thicknesses (heights) of CMP sacrifice layer patterns. The top electrode thickness remains the same for all sizes of devices due to the protection of the CMP stop layer. By choosing proper slurries during the following CMP process, any remaining sacrifice patterns are completely removed, stopping on the CMP stop layer. The CMP stop layer is then removed by plasma etch, exposing the top electrode underneath. Using this method, different size MTJ cells retain the same height of their top electrode, making it easier to connect the later deposited top metal contact. Any yield loss due to electric opens is avoided. This method benefits the future generation of sub 60 nm MRAM products as well as other fabrications having small sizes.

BRIEF DESCRIPTION OF THE DRAWINGS

FIG. 2 is a table describing two slurries used to create CMP polishes with different polishing rates on different elements of a layered MRAM device.

DETAILED DESCRIPTION

A schematic set of illustrations of the process flow is shown in FIGS. 1A-1F, where there is shown the application of the method to simultaneously create two adjacent exemplary MTJ devices of different sizes but having top electrodes of substantially the same heights and coplanar upper surfaces so that the devices may be advantageously connected by a common metal contact without the formation of electrical opens (open circuits).

Figure 1A:
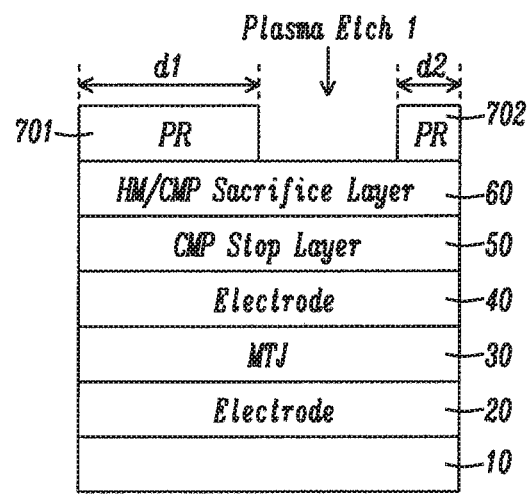
FIGS. 1A, 1B, 1C, 1D, 1E and 1F is a series of schematic illustrations showing the process flow of fabricating high yield MRAM devices of various sizes.

Referring first to FIG. 1A, there is schematically shown a single stack structure about to be patterned into two adjacent but separated MTJ devices by a first plasma etch. It is understood that two devices are exemplary to simplify the description and an array comprising a multiplicity of such separated devices is contemplated. We note here that the MTJ device is one type of active device element that may be processed using the following methodology, but any type of active multilayered device may be formed into an array including devices of various widths and provided with top electrodes having coplanar upper surfaces on which a single electrically connecting layer may be advantageously formed with no open circuits between array elements.

From the bottom up, there is shown a substrate layer 10, which may be a common electrical contact such as a layer of Ta, TaN, Ti or TiN or the top of an additional integrated electronic structure, a bottom electrode 20, a multilayered MTJ stack 30, a top electrode 40 of thickness between approx. 200-1000 A, a CMP stop layer 50 of thickness between approx. 20-300 A, a CMP sacrifice layer 60, of thickness between approx. 200-1000 A which is either alone or formed in combination with a hard mask (HM) layer (not separately shown) of thickness between approx. 200-2000 A. The additional hard mask (HM) layer, which is not shown here, may be deposited on the sacrifice layer 60 to improve the subsequent plasma etch selectivity. Note, the addition of a dielectric hard mask (HM) layer to improve the etch selectivity while etching the CMP sacrifice layer can be thought of as producing a "thick hard mask", where the combination works together to improve overall selectivity. For example, one can use plasma gas species such as CHF3, CH2F2 or C4F8 that will readily etch the HD, but which has a very low etch rate on the photoresist. Finally a photoresist layer (PR) is formed to a thickness of between approx. 1000-3000 A on the hard mask (if present) or sacrifice layer 60. The photoresist layer is shown as already having been photolithographically patterned into two portions, 701 and 702 of dimension d1 and d2 respectively, which will ultimately lead to the formation of two MTJ devices of those dimensions. The top electrode 40, deposited freely on top of the MTJ stack 30, is a layer of conducting material such as Ta, Ti, TaN or TiN. The CMP stop layer 50, is a layer of SiO2 or SiON and is deposited on the top electrode. The CMP sacrifice layer 60 is a layer of Ta, Ti, TaN and TiN and it is then deposited onto the CMP stop layer. Alternatively, to improve the subsequent plasma etch selectivity and pattern integrity, a dielectric hard mask, such as layer of SiN, SiO2 or SiON can be deposited on top of the CMP sacrifice layer (not specifically shown). Photoresist patterns 701 and 702 are formed by photolithography as is well known in the art. As also shown in FIG. 1a, two exemplary photoresist pattern sizes of d1 and d2, where d1>d2, are created here to help better understand how this method works. For this example, the width d1 is approx. 60-100 nm and d2 is approx. 10-60 nm.

An important aspect of the exemplary process being shown herein is that one of the MTJ devices is larger (in horizontal dimension) than the other so that the etching process also leads to a different thickness (vertical dimension) which can have negative impact on process yields. A first plasma etch is shown being applied to the opening between 701 and 702 to separate the stack.

Figure 1B:
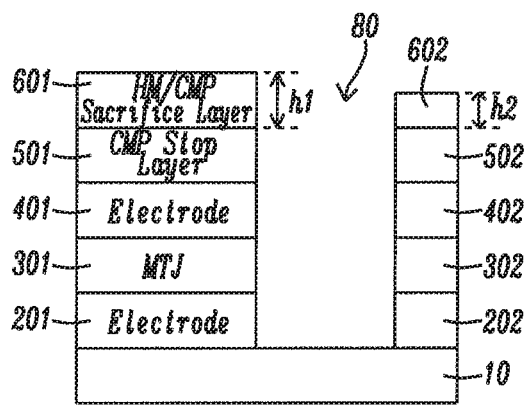

Referring next to FIG. 1B, there is shown the structure of FIG. 1A after a plasma etch (reactive ion RIE, ion-beam IBE or their combination) of the whole stack which leaves a space 80 between two remaining portions each of substantially uniform width d1 and d2 respectively. The portion of the stack having the larger size d1 includes a remaining CMP sacrifice layer portion 601 having a final thickness h1 that is larger than h2, the thickness of the smaller size pattern's CMP sacrifice layer 602. This final thickness difference is because the smaller layer of photoresist (702 in FIG. 1A) over the now smaller size pattern portion 602, is consumed more quickly during the plasma etch process, leading to part of the CMP sacrifice layer 602 being etched away as well. One can imagine that if the top electrode (40 in FIG. 1A) were located directly underneath the photoresist and/or the not-shown dielectric hard mask HM, then it would be the electrode portions 401 and 402 that would be left with different thicknesses instead of 601 and 602.

Figure 1C:
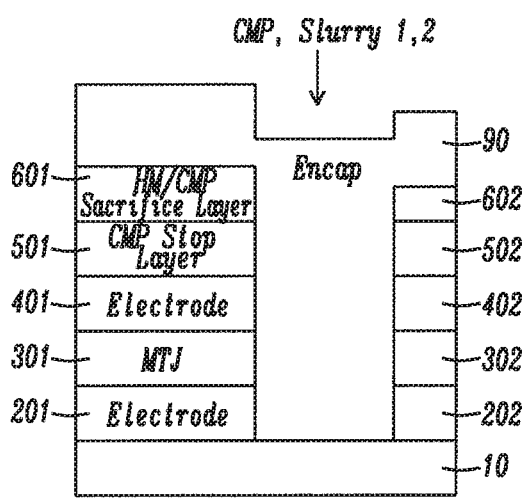

As shown in schematic FIG. 1C, after plasma etch, an encapsulation layer 90 is deposited into the patterned MTJ stack filling the space 80 (in FIG. 1B) between them. This layer is typically SiN, SC, or SiCN and is deposited by chemical vapor deposition (CVD). Next as also shown in FIG. 1C, a first CMP is applied, using slurry 1 as listed in Table 1, that provides a high polish rate for the encapsulation materials 80 as well as the alternative additional dielectric hard mask (if one is used). This first CMP process is applied to completely remove an upper portion of the encapsulation layer and additional hard mask portions (if present), stopping at the remaining CMP sacrifice layers 601 and 602.

As now also shown in FIG. 1C, a CMP process employing slurry 2, as listed in Table 1, is then used to completely polish away the remaining CMP sacrifice layer 601 and 602. This process stops on the CMP stop layers 501 and 502, since slurry 2 has an extremely low polish rate for the material of the CMP stop layers.

Figure 1D:
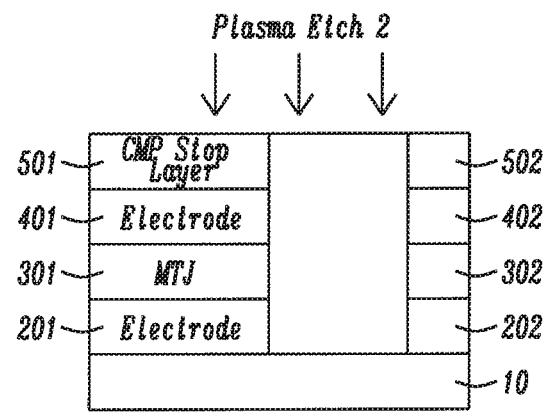
Figure 1E:
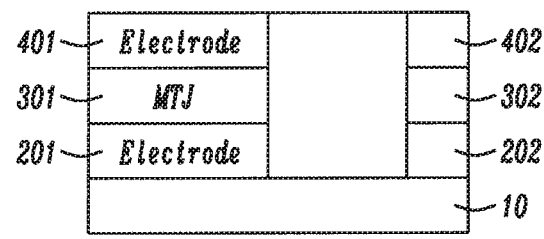

Next as shown schematically in FIG. 1D, a second plasma etch is applied again to etch back the CMP stop layer 501 and 502, exposing the upper surfaces of top electrode 401 and 402 underneath. As shown schematically in FIG. 1E, the resulting exposed top surfaces of the electrodes 401 and 402 are now coplanar and the two MTJ devices 301 and 302 are now electrically separate and completely defined by both upper 401, 402 and lower 201, 202 electrodes. At this point the devices are both at the same height and any height differences that were created by the first etch process shown in FIG. 1b have been eliminated.

Figure 1F:
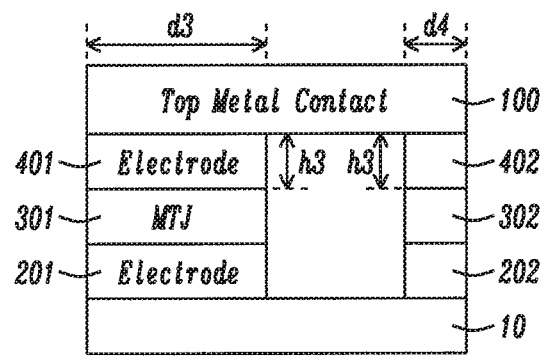

Finally as shown in FIG. 1F, a common top metal contact 100, such as a layer of Ta, TaN, Ti, Al or Cu is deposited onto the coplanar surfaces of top electrodes 401 and 402 to form an electrical connection to the two exemplary (and otherwise electrically separate) MTJ devices 301 and 302. Large size pattern final width d3 and small size pattern final width d4 each have their own separate top electrodes 401 and 402 with coplanar upper surfaces and the same top electrode thickness h3, preventing any yield loss due to formation of electric opens when the top connection 100 is formed.

As is finally understood by a person skilled in the art, the detailed description given above is illustrative of the present disclosure rather than limiting of the present disclosure. Revisions and modifications may be made to methods, materials, structures and dimensions employed in forming and providing a multiplicity of small (in the horizontal dimensional range of approx. 60 nm) MTJ devices having top electrodes of uniform thickness (vertical dimension) and thereby to improve device yield, while still forming and providing such a structure and its method of formation in accord with the spirit and scope of the present invention as defined by the appended claims.

What is claimed is:

1. A method comprising:
    forming a bottom electrode over a substrate;
    forming a stack of magnetic tunnel junction (MTJ) layers over the bottom electrode;
    forming a top electrode over the stack of MTJ layers;
    forming a first layer over the top electrode;
    forming a second layer over the first layer, the second layer being formed of a different material than the first layer;
    patterning the second layer, the first layer, the top electrode, the stack of MTJ layers and the bottom electrode to form a first patterned stack of layers and a second patterned stack of layers, the first patterned stack of layers including a first portion of the patterned second layer, a first portion of the patterned first layer, a first portion of the patterned top electrode, a first portion of the patterned stack of MTJ layers and a first portion of the patterned bottom electrode and the second patterned stack of layers including a second portion of the patterned second layer, a second portion of the patterned first layer, a second portion of the patterned top electrode, a second portion of the patterned stack of MTJ layers and a second portion of the patterned bottom electrode, the first patterned stack of layers extending to a first height over the substrate and the second patterned stack of layers extending to a second height of the substrate, the second height being different than the first height;

removing the first portion of the second layer and the first portion of the first layer from the first patterned stack of layers to thereby expose the first portion of the top electrode and removing the second portion of the second layer and the second portion of the first layer from the second patterned stack of layers to thereby expose the second portion of the top electrode; and forming a metal contact layer directly on the exposed first portion of the top electrode and directly on the exposed second portion of the top electrode.

2. The method of claim 1, further comprising forming an encapsulation layer over the first patterned stack of layers and the second patterned stack of layers prior to the removing of the first portion of the second layer and the first portion of the first layer from the first patterned stack of layers.

3. The method of claim 2, wherein the removing of the first portion of the second layer and the first portion of the first layer from the first patterned stack of layers and the removing of the second portion of the second layer and the second portion of the first layer from the second patterned stack of layers further includes removing a first portion of the encapsulation layer.

4. The method of claim 3, wherein the forming of the metal contact layer directly on the exposed first portion of the top electrode and directly on the exposed first portion of the top electrode further includes forming the metal contact layer directly on a second portion of the encapsulation layer.

5. The method of claim 1, wherein the first patterned stack of layers has a substantially uniform first width measured in a direction parallel to a top surface of the substrate, and
wherein the second patterned stack of layers has a substantially uniform second width measured in the direction parallel to the top surface of the substrate, wherein the second width is different than the first width.

6. The method of claim 1, wherein the exposed first portion of the top electrode has a top surface that is substantially coplanar with a top surface of the exposed second portion of the top electrode.

7. The method of claim 1, wherein the removing of the first portion of the second layer and the first portion of the first layer from the first patterned stack of layers to thereby expose the first portion of the top electrode and the removing of the second portion of the second layer and the second portion of the first layer from the second patterned stack of layers to thereby expose the second portion of the top electrode includes:
performing a first chemical mechanical polishing process using a first slurry composition;
performing a second chemical mechanical polishing process using a second slurry composition that is different from the first slurry composition; and
performing a plasma etching process.

8. A method comprising:
forming a first stack of layers and a second stack of layers over a substrate, the first stack of layers and the second stack of layers including the same type and number of layers, the first stack of layers having a substantially uniform first width measured in a direction parallel to the substrate and extending to a first height above the substrate, the second stack of layers having a substantially uniform second width measured in the direction parallel to the substrate and extending to a second height above the substrate, the first width being different than the second width and the first height being different than the second height, the first and second stack of layers each including a bottom electrode, a stack of magnetic tunnel junction (MTJ) layers over the bottom electrode, a top electrode over the stack of MTJ layers and a sacrificial layer disposed over the top electrode;

removing the sacrificial layer from the first stack of layers to expose the top electrode of the first stack of layers and removing the sacrificial layer from the second stack of layers to expose the top electrode of the second stack of layers, wherein a top surface of the exposed top electrode of the first stack of layers is substantially coplanar with a top surface of the exposed top electrode of the second stack of layers; and forming a metal contact layer directly on the top surface of the exposed top electrode of the first stack of layers and directly on the top surface of the exposed top electrode of the second stack of layers.

9. The method of claim 8, wherein the removing of the sacrificial layer from the first stack of layers to expose the top electrode of the first stack of layers and the removing of the sacrificial layer from the second stack of layers to expose the top electrode of the second stack of layers includes performing a chemical mechanical polishing process and a plasma etching process.

10. The method of claim 8, wherein the sacrificial layer includes a first material layer and a second material layer formed of a different material than the first material.

11. The method of claim 8, wherein the sacrificial layer includes a hard mask layer.

12. The method of claim 8, further comprising forming an encapsulation layer over the first stack of layers and the second stack of layers such that the encapsulation layer extends from the first stack of layers to the second stack of layers.

13. The method of claim 12, wherein the removing of the sacrificial layer from the first stack of layers to expose the top electrode of the first stack of layers and the removing of the sacrificial layer from the second stack of layers to expose the top electrode of the second stack of layers includes removing a first portion of the encapsulation layer, and
wherein a second portion of the encapsulation layer remains disposed between the first stack and the second stack of layers after the removing of the first portion of the encapsulation layer, and
wherein the second portion of the encapsulation layer has a top surface that is substantially coplanar with the respective top surfaces of the exposed top electrode of the first stack of layers and the second stack of layers.

14. The method of claim 8, wherein the sacrificial layer includes a material selected from the group consisting of Ta and Ti.

15. A method comprising:
providing a substrate;
forming on the substrate a multilayered stack comprising:
a bottom electrode over the substrate;
functional device layers over the bottom electrode;
a top electrode over the function device layers;

a chemical mechanical polishing (CMP) stop layer over the top electrode;

a CMP sacrifice layer over the CMP stop layer;

a patterned photoresist layer over the CMP sacrifice layer; and patterning the multilayered stack using the patterned photoresist layer, wherein the patterning of the multilayered stack includes:

applying a first etching process to etch through the patterned photoresist layer to separate the multilayered stack into an array of separated portions, each portion of the array having a unique width and a unique height; and removing the CMP sacrifice layer and the CMP stop layer from each portion of the array to expose the top electrode in each portion of the array, wherein respective top surfaces of the exposed top electrodes of each portion in the array are substantially coplanar with each other after the removing of the CMP sacrifice layer and the CMP stop layer from each portion of the array.

16. The method of claim 15, wherein the patterning of the multilayered stack further includes:

refilling portions of the multilayered stack removed by the first etching process by forming an encapsulation layer therein, and wherein the removing of the CMP sacrifice layer and the CMP stop layer from each portion of the array to expose the top electrode in each portion of the array includes:

using a first slurry and a first CMP process to remove a top portion of the encapsulation layer and stopping at the CMP sacrifice layer in each portion of the array;

using a second slurry and a second CMP process to remove the CMP sacrifice layer and stopping at the CMP stop layer in each portion of the array, the second slurry being a different composition than the first slurry; and applying a second etching process to remove the CMP stop layer exposed by the second CMP process thereby exposing the top electrode on each portion of the array.

17. The method of claim 16, wherein the first slurry includes zirconium oxide particles, and wherein the second slurry includes aluminum oxide particles.

18. The method of claim 15, wherein the CMP sacrifice layer is a layer of Ta, Ti, TaN or TiN.

19. The method of claim 15, wherein the CMP stop layer is a layer of SiO2 or Si ON.

20. The method of claim 15, wherein a top surface of the encapsulation layer between adjacent portions of the array is substantially coplanar with the respective top surfaces of the top electrode of the adjacent portions of the array.

* * * * *